(12) United States Patent
Huang et al.

(10) Patent No.: US 11,832,498 B2
(45) Date of Patent: Nov. 28, 2023

(54) ORGANIC LIGHT-EMITTING DISPLAY SUBSTRATE, MANUFACTURING METHOD THEREOF, AND ORGANIC LIGHT-EMITTING DISPLAY DEVICE

(71) Applicant: BOE TECHNOLOGY GROUP CO., LTD., Beijing (CN)

(72) Inventors: Haitao Huang, Beijing (CN); Shi Shu, Beijing (CN); Yang Yue, Beijing (CN); Xiang Li, Beijing (CN); Yong Yu, Beijing (CN); Chuanxiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 718 days.

(21) Appl. No.: 17/043,358

(22) PCT Filed: Mar. 9, 2020

(86) PCT No.: PCT/CN2020/078403
§ 371 (c)(1),
(2) Date: Sep. 29, 2020

(87) PCT Pub. No.: WO2020/238317
PCT Pub. Date: Dec. 3, 2020

(65) Prior Publication Data
US 2022/0328575 A1    Oct. 13, 2022

(30) Foreign Application Priority Data

May 28, 2019    (CN) .......................... 201910449719.6

(51) Int. Cl.
*H10K 59/60*    (2023.01)
*H10K 59/38*    (2023.01)
*H10K 71/00*    (2023.01)

(52) U.S. Cl.
CPC .............. *H10K 59/60* (2023.02); *H10K 59/38* (2023.02); *H10K 71/00* (2023.02)

(58) Field of Classification Search
CPC ........ H10K 59/60; H10K 59/38; H10K 71/00; H10K 59/1201; H10K 50/125; H10K 59/124; H10K 59/13
See application file for complete search history.

(56) References Cited

U.S. PATENT DOCUMENTS

2020/0409212 A1    12/2020    Yue et al.

FOREIGN PATENT DOCUMENTS

| CN | 108963112 A | 12/2018 |
| CN | 109065595 A | 12/2018 |

(Continued)

OTHER PUBLICATIONS

First Office Action dated Sep. 30, 2020, relating to CN Patent Application No. 201910449719.6.

(Continued)

*Primary Examiner* — Elias Ullah
(74) *Attorney, Agent, or Firm* — DINSMORE & SHOHL LLP

(57) ABSTRACT

The present disclosure relates to an organic light-emitting display substrate, manufacturing method thereof, and organic light-emitting display device. The organic light-emitting display substrate includes a base and a plurality of sub-pixel structures on the base, the sub-pixel structure includes: a first protrusion including a photoelectric sensing device and a second protrusion including a color filter layer, a protrusion height of the first protrusion relative to the base being smaller than that of the second protrusion relative to the base; a planarization layer on the first and second protrusions, and in contact with the first and second protrusions, a material wettability of the planarization layer with (Continued)

Fig.7d respect to the surface of the first protrusion being greater than that with respect to the surface of the second protrusion; and a white organic light-emitting diode on the planarization layer, and emitting light towards the first and second protrusions.

16 Claims, 5 Drawing Sheets

(56) References Cited

FOREIGN PATENT DOCUMENTS

| CN | 109300395 A | 2/2019 |
|---|---|---|
| CN | 110085653 A | 8/2019 |
| JP | 2008241827 A | 10/2008 |
| JP | 2012159483 A | 8/2012 |

OTHER PUBLICATIONS

"Microfabrication Technology of Semiconductor Integrated Circuits," Zhang Yafei, et al, Higher Education Press, pp. 109-110, Jun. 1, 2006.

ORGANIC LIGHT-EMITTING DISPLAY SUBSTRATE, MANUFACTURING METHOD THEREOF, AND ORGANIC LIGHT-EMITTING DISPLAY DEVICE

CROSS-REFERENCE TO RELATED APPLICATIONS

This application is a U.S. National Stage Application under 35 U.S.C. § 371 of International Patent Application No. PCT/CN2020/078403, filed on Mar. 9, 2020, which is based on and claims the priority to the Chinese Patent Application No. 201910449719.6, filed on May 28, 2019, the disclosures of which are hereby incorporated by reference in their entirety.

TECHNICAL FIELD

The present disclosure relates to the technical field of display, and particularly to an organic light-emitting display substrate, a manufacturing method thereof, and an organic light-emitting display device.

BACKGROUND

In an organic light-emitting display device in the related art, a sub-pixel structure of the organic light-emitting display substrate thereof comprises a photoelectric sensing device, a color filter layer, and a white organic light-emitting diode. The white light emitted from the white organic light-emitting diode presents primary color light after being filtered by the color filter layer. The photoelectric sensing device detects a light intensity of the white light emitted by the white organic light-emitting diode. In order to improve stability of the light intensity, a control chip of the organic light-emitting display device performs driving compensation on the white organic light-emitting diode according to a photocurrent of the photoelectric sensing device.

SUMMARY

According to an aspect of the embodiments of the present disclosure, there is provided an organic light-emitting display substrate comprising a base and a plurality of sub-pixel structures located on one side of the base, the sub-pixel structure comprising:

a first protrusion comprising a photoelectric sensing device and a second protrusion comprising a color filter layer, a protrusion height of the first protrusion relative to the base being smaller than a protrusion height of the second protrusion relative to the base;

a planarization layer located on one sides of the first protrusion and the second protrusion away from the base, and being in contact with surfaces of the first protrusion and the second protrusion, a material wettability of the planarization layer with respect to the surface of the first protrusion being greater than that with respect to the surface of the second protrusion; and a white organic light-emitting diode located on one side of the planarization layer away from the base, and emitting light towards the first protrusion and the second protrusion.

In some embodiments, the surface of the first protrusion has a lyophilic first transparent optical layer; and/or the surface of the second protrusion has a lyophobic second transparent optical layer.

In some embodiments, the surface of the first protrusion has a lyophilic first transparent optical layer, the surface of the second protrusion has a lyophobic second transparent optical layer, and a thickness of the first transparent optical layer is greater than that of the second transparent optical layer.

In some embodiments, the first transparent optical layer has a thickness of 1 to 2 microns and the second transparent optical layer has a thickness of 0.5 to 1.5 microns.

In some embodiments, the surface of the first protrusion has a lyophilic first transparent optical layer, the surface of the second protrusion has a lyophobic second transparent optical layer, a material of the first transparent optical layer comprises a light-cured transparent resin, and a material of the second transparent optical layer comprises a thermo-cured transparent resin.

In some embodiments, the first protrusion further comprises a silicon organic hybrid glass layer located on one side of the photoelectric sensing device close to the base, the photoelectric sensing device being located on a surface of the silicon organic hybrid glass layer.

In some embodiments, a thickness of the silicon organic hybrid glass layer is 0.2 to 1 microns.

In some embodiments, the photoelectric sensing device comprises a receiving electrode, an N-type semiconductor layer, an I-type semiconductor layer, a P-type semiconductor layer, and a transparent electrode, arranged in this order in a direction away from the base; and the first protrusion has a hollow structure exposing the transparent electrode, and the planarization layer is in contact with the transparent electrode through the hollow structure.

In some embodiments, the hollow structure comprises a hollow hole, a hollow groove or a hollow grid.

In some embodiments, an orthographic projection of the hollow structure on the transparent electrode accounts for 50% to 80% of an area of the transparent electrode.

According to another aspect of the embodiments of the present disclosure, there is provided an organic light-emitting display device comprising a driving back panel and the organic light-emitting display substrate according to any one of the preceding embodiments.

According to still another aspect of the embodiments of the present disclosure, there is provided a manufacturing method of an organic light-emitting display substrate, comprising:

forming a first protrusion structure and a second protrusion structure corresponding to each sub-pixel structure on one side of a base, wherein the first protrusion structure comprises a photoelectric sensing device, the second protrusion structure comprises a color filter layer, and a protrusion height of the first protrusion structure relative to the base is smaller than that of the second protrusion structure relative to the base;

forming a first transparent optical layer on a surface of the first protrusion structure to obtain a first protrusion, and forming a second transparent optical layer on a surface of the second protrusion structure to obtain a second protrusion;

forming a planarization layer on one sides of the first transparent optical layer and the second transparent optical layer away from the base, wherein a material wettability of the planarization layer with respect to the first transparent optical layer is greater than that with respect to the second transparent optical layer; and forming a white organic light-emitting diode one side of the planarization layer away from the base, that emits light towards the first protrusion structure and the second protrusion structure.

In some embodiments, the first transparent optical layer and the second transparent optical layer are formed by a one patterning process, respectively.

In some embodiments, forming the first transparent optical layer and the second transparent optical layer comprises:

forming a transparent optical layer on the surface of the first protrusion structure and the surface of the second protrusion structure, wherein a part of the transparent optical layer on the surface of the second protrusion structure is the second transparent optical layer; and adjusting to increase a lyophilic property of a part of the transparent optical layer on the surface of the first protrusion structure to form the first transparent optical layer.

In some embodiments, forming the first transparent optical layer and the second transparent optical layer comprises:

forming a transparent optical layer on the surface of the first protrusion structure and the surface of the second protrusion structure, wherein a part of the transparent optical layer on the surface of the first protrusion structure is the first transparent optical layer; and adjusting to decrease a lyophilic property of a part of the transparent optical layer on the surface of the second protrusion structure to form the second transparent optical layer.

In some embodiments, that forming a first protrusion structure corresponding to each sub-pixel structure on one side of a base comprises:

forming a silicon organic hybrid glass layer on one side of the base; and forming a photoelectric sensing device on a surface of the silicon organic hybrid glass layer.

Further features of the present disclosure and advantages thereof will become apparent from the following detailed description of exemplary embodiments with reference to the accompanying drawings.

BRIEF DESCRIPTION OF THE DRAWINGS

The accompanying drawings, which constitute a part of the specification, illustrate the embodiments of the present disclosure and, together with the description, serve to explain the principles of the present disclosure.

The present disclosure will be understood more clearly according to the following detailed description with reference to the accompanying drawings, in which.

Please be appreciated that, the sizes of various portions shown in the accompanying drawings are not drawn to actual scale. Furthermore, identical or similar reference numerals are used to refer to identical or similar members.

DETAILED DESCRIPTION

Figure 1:
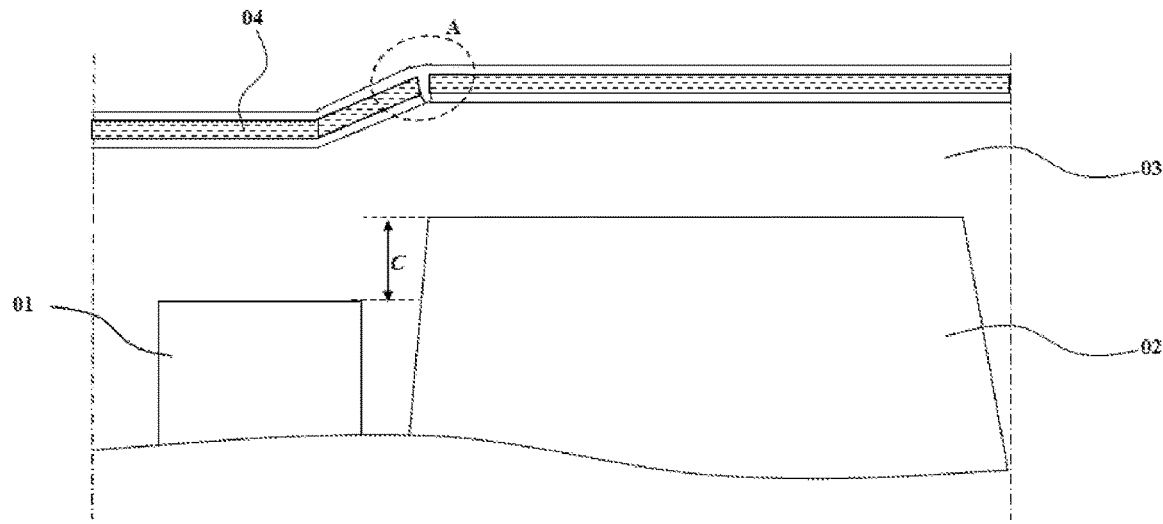
FIG. 1 is a schematic cross-sectional view illustrating a sub-pixel structure of an organic light-emitting display substrate in the related art.

Various exemplary embodiments of the present disclosure will be described in detail with reference to the accompanying drawings in the following. The following description of the exemplary embodiments is merely illustrative in nature and is in no way intended to limit this disclosure, its application, or uses. The present disclosure may be implemented in many different forms and is not limited to the embodiments described herein. These embodiments are provided merely for making the present disclosure thorough and complete, and sufficiently expressing the scope of the present disclosure to one of ordinary skill in the art. It should be noted that the relative arrangement of the components and steps, compositions of materials, the numerical expressions, and numerical values set forth in these embodiments are interpreted to be merely illustrative instead of restrictive, unless it is specifically stated otherwise.

The words "first", "second" and the like used in the present disclosure do not imply any sequence, number or importance, but are merely used to distinguishing different portions. The word "comprise" or "include" or the like means that an element preceding the word covers elements listed following the word, but does not preclude the possibility of covering also other elements. The terms "up", "down", and the like are merely used for implying relative position relations, and after an absolute position of the object described changes, the relative position relation may possibly change correspondingly.

In this disclosure, when a specific device is described between a first device and a second device, an intermediate device may exist between the specific device and the first device or the second device, or an intermediate device may not exist. When a specific device is described to be connected to another device, the specific device may be directly connected with the another device without an intermediate device, or it may not be directly connected with the another device but has an intermediate device.

All terms (including technical or scientific terms) used in this disclosure have the same meanings as understood by one of ordinary skill in the art, unless otherwise specifically defined. It should also be understood that the terms defined in common dictionaries should be interpreted as having meanings consistent with their meanings in the context of the relevant technologies, but should not be interpreted with idealized or extremely formalized meanings, unless otherwise expressly defined herein.

Techniques, methods and apparatus as known by one of ordinary skill in the relevant art may not be discussed in detail, but are intended to be regarded as a part of the specification where appropriate.

In an organic light-emitting display device in the related art, a sub-pixel structure of its organic light-emitting display substrate comprises a photoelectric sensing device, a color filter layer, and a white organic light-emitting diode. The photoelectric sensing device and the color filter layer are arranged on the light-emitting side of the white organic light-emitting diode and are not overlapped. The white light emitted by the white light organic light-emitting diode presents primary color light after being filtered by the color filter layer. The primary color lights emitted by at least two adjacent sub-pixel structures with different colors can present various colors after being mixed in proportion. The photoelectric sensing device detects a light intensity of the white light emitted by the white organic light-emitting diode. A control chip of the organic light-emitting display device performs driving compensation on the white organic light-emitting diode according to a photocurrent of the photoelectric sensing device, so as to improve stability of the light intensity.

The inventors of the present application found in the process of implementing the embodiments of the present disclosure that, when the organic light-emitting display substrate in the related art is manufactured, due to a significant misalignment or step C existing between the photoelectric sensing device 01 and the color filter layer 02 as shown in FIG. 1, a planarization layer 03 continuously manufactured on the photoelectric sensing device 01 and the color filter layer 02 is difficult to achieve a good planarization effect. If the planarization effect of the planarization layer 03 is unsatisfactory, when evaporating an organic light-emitting layer 04 of the white organic light-emitting diode thereafter, the organic light-emitting layer 04 is easily broken, as shown in A of FIG. 1. The breakage of the organic light-emitting layer 04 is very likely to cause short circuit of the cathode and anode after the white organic light-emitting diode is manufactured, and thus cannot emit light normally.

In view of the above problems, the embodiments of the present disclosure provide an organic light-emitting display substrate, an organic light-emitting display device, and a manufacturing method of the organic light-emitting display substrate, so as to improve the situation of breakage when evaporating the organic light-emitting layer and improve a production yield of the product.

Figure 2:
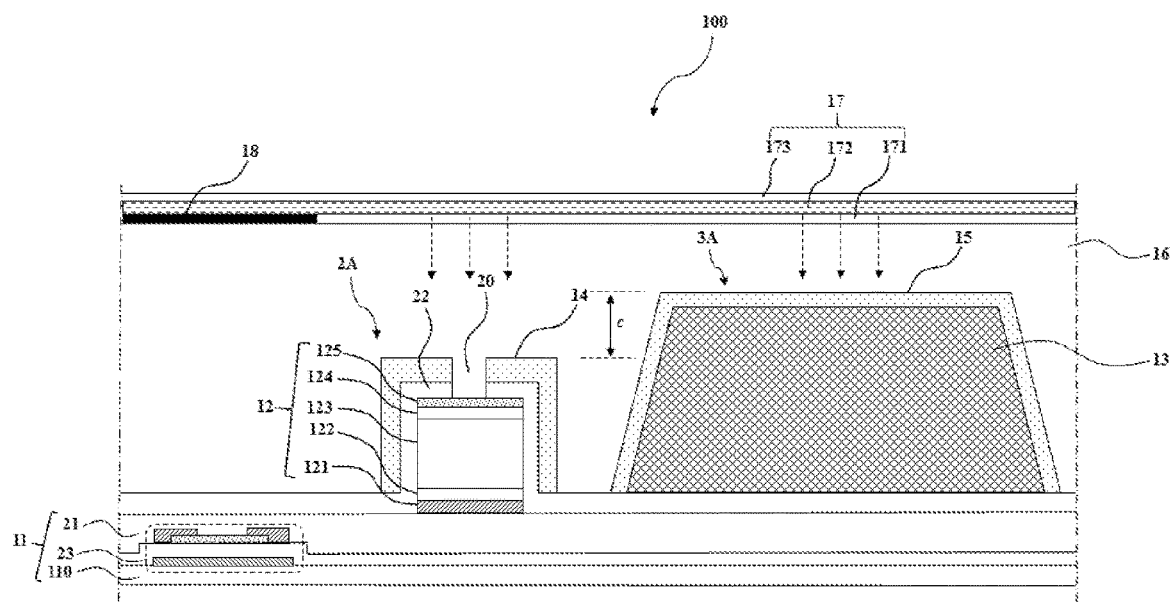
FIG. 2 is a schematic cross-sectional view illustrating a sub-pixel structure of an organic light-emitting display substrate according to an embodiment of the present disclosure.

FIG. 2 is a schematic cross-sectional view illustrating an organic light-emitting display substrate according to an embodiment of the present disclosure. As shown in FIG. 2, the organic light-emitting display substrate comprises a base 11 and a plurality of sub-pixel structures 100 (only a cross-sectional structure of one sub-pixel structure 100 is illustrated in FIG. 2) located on one side of the base 11.

A sub-pixel structure 100 comprises:

a first protrusion 2A and a second protrusion 3A, the first protrusion 2A comprising a photoelectric sensing device 12, the second protrusion 3A comprising a color filter layer 13, a protrusion height of the first protrusion 2A relative to the base 11 being smaller than a protrusion height of the second protrusion 3A relative to the base 11, that is, a misalignment c is formed between the first protrusion 2A and the second protrusion 3A;

a planarization layer 16 located on one sides of the first protrusion 2A and the second protrusion 3A away from the base 11 and being in contact with surfaces of the first protrusion 2A and the second protrusion 3A, a material wettability of the planarization layer 16 with respect to the surface of the first protrusion 2A being greater than a material wettability with respect to the surface of the second protrusion 3A; and a white organic light-emitting diode 17 located on one side of the planarization layer 16 away from the base 11, and emitting light towards the first protrusion 2A and the second protrusion 3A.

In the embodiments of the present disclosure, a specific material type of the planarization layer 16 is not limited, and for example, a photosensitive or non-photosensitive resin material may be adopted. In some embodiments of the present disclosure, the planarization layer 16 is formed by coating and then curing. The planarization layer 16 is in a liquid state before curing, and has fluidity.

Wettability refers to a tendency that an immiscible liquid flows and extends on or clings to a solid surface. A tangent of a gas-liquid interface is made at an intersection point of three phases of gas, liquid and solid, wherein an angle θ between one side of the tangent close to the liquid and a solid-liquid boundary is a contact angle of the liquid on the solid surface. The contact angle is a measure of how wet a liquid is to the surface of a material. A material wettability of the planarization layer 16 with respect to the surface of the first protrusion 2A is greater than that with respect to the surface of the second protrusion 3A, that is, the contact angle at the surface of the first protrusion 2A is smaller than the contact angle at the surface of the second protrusion 3A when the planarization layer 16 is in a liquid state.

Continuously with reference to FIG. 2, the white organic light-emitting diode 17 is of a bottom emission type, that is, the white organic light-emitting diode 17 emits light toward the base 11, as shown by the direction of the dotted arrows. The white light emitted from the white organic light-emitting diode 17 is filtered by the color filter layer 13 to present primary color light. The primary color lights emitted by at least two adjacent sub-pixel structures with different colors can present various colors after being mixed in proportion. At least two adjacent primary colors with different colors can present other colors after being mixed in proportion. The main structure of the white organic light-emitting diode 17 comprises a transparent anode 171, a white organic light-emitting layer 172, and a reflective cathode 173, arranged in this order in a direction away from the base 11. The transparent anodes 171 of the respective white organic light-emitting diodes 17 are spaced apart by a pixel defining layer 18. The reflective cathodes 173 of the respective white organic light-emitting diodes 17 or the reflective cathodes 173 of some of the white organic light-emitting diodes 17 are connected as a single body to have an equal potential. Since each white organic light-emitting diode 17 comprises the white organic light-emitting layer 172, the white organic light-emitting layer 172 of each white organic light-emitting diode 17 or the organic light-emitting layers 172 of some white organic light-emitting diodes 17 may be integrally formed by large-area evaporation, so that the manufacturing process is simplified while the manufacturing accuracy is improved, and the manufacturing cost is reduced.

Continuously with reference to FIG. 2, in order to improve the light-emitting stability of the white organic light-emitting diode 17, the sub-pixel structure 100 comprises a photoelectric sensing device 12. In some embodiments, the photoelectric sensing device 12 employs a PIN (positive-intrinsic-negative) type photodiode comprising a receiving electrode 121, an N-type semiconductor layer 122, an I-type semiconductor layer 123, a P-type semiconductor layer 124, and a transparent electrode 125 sequentially arranged in this order in a direction away from the base 11.

The transparent electrode 125 is connected to a bias signal line (not shown) for receiving a bias voltage signal. The receiving electrode 121 is connected to a data transmission line for receiving and transmitting the photocurrent generated from a PIN layer. The control chip of the organic light-emitting display device applies a certain compensation algorithm according to the photocurrent of the PIN type photodiode, thereby performing driving compensation on the white organic light-emitting diode 17, to improve the stability of the light intensity, and improve the display effect. The photoelectric sensing device 12 is not limited to the PIN type photodiode, but may be also a MIS (metal-insulative-semiconductor) type photodiode or the like in other embodiments of the present disclosure.

Continuously with reference to FIG. 2, in some embodiments of the present disclosure, the base 11 is a thin film transistor base, and comprises a transparent base 110, and a thin film transistor 23 and a first insulating layer 21 arranged in this order in a direction close to the white organic light-emitting diode 17.

The thin film transistor 23, as a switching device, is disposed in a region opposite to the pixel defining layer 18, for controlling the state of the white organic light-emitting diode 17. The thin film transistor 23 is not limited in specific type, and may be a top gate type or a bottom gate type, and may be a low temperature polysilicon thin film transistor, an amorphous silicon thin film transistor, or a metal oxide thin film transistor, etc. The first insulating layer 21 serves to insulate and isolate the thin film transistor 23 from the photoelectric sensing device 12.

In addition, in some embodiments of the present disclosure, the first protrusion 2A further comprises: a second insulating layer 22 located on one side of the photoelectric sensing device 12 away from the base 11, in which area the color filter layer 13 may be disposed on one side of the second insulating layer 22 away from the base 11. The second insulating layer 22 may protect the photoelectric sensing device 12. In addition, since the transparent electrode 125 of the photoelectric sensing device 12 and the bias signal line are generally made of different materials and made in different layers, the layer where the transparent electrode 125 is located and the layer where the bias signal line is located can be separated by the second insulating layer 22. The bias signal line may be connected to the transparent electrode 125 through a via hole on the second insulating layer 22.

In the embodiments of the present disclosure, although a misalignment is formed between the first protrusion 2A and the second protrusion 3A, since the material wettability of the planarization layer 16 with respect to the surface of the first protrusion 2A is greater than that with respect to the surface of the second protrusion 3A, when the planarization layer 16 is manufactured, the planarization layer material having fluidity tends to flow to the area where the first protrusion 2A is in. Thus, the planarization layer 16 can be formed with a greater thickness on one side of the first protrusion 2A away from the base 11 to compensate for the step, thereby effectively improving the planarity of the planarization layer 16. The improvement of the planarity of the planarization layer 16 can effectively reduce the occurrence of breakage during the subsequent evaporation of the white organic light-emitting layer 172, thereby improving the production yield of the product.

On the other hand, since the planarization layer 16 is formed with a greater thickness on one side of the first protrusion 2A away from the base 11, a minimum spacing between the photoelectric sensing device 12 and the white organic light-emitting diode 17 is increased. Therefore, a parasitic capacitance between the photoelectric sensing device 12 and the white organic light-emitting diode 17 is reduced, which is beneficial to reducing the interference between the devices and improving the display quality.

On the other hand, since the misalignment between the first protrusion 2A and the second protrusion 3A can be compensated for by adjusting the thickness of the planarization layer 16 above, it can be appropriately designed to increase the thickness of the color filter layer 13, such that the planarization layer 16 still has good planarity. The increased thickness of the color filter layer 13 can effectively improve the displayed color gamut, so that the organic light-emitting display device has a better display effect.

As shown in FIG. 2, in some embodiments, the surface of the first protrusion 2A has a lyophilic first transparent optical layer 14, and the surface of the second protrusion 3A has a lyophobic second transparent optical layer 15, so that the material wettability of the planarization layer 16 with respect to the surface of the first protrusion 2A is greater than that with respect to the surface of the second protrusion 3A.

The surface of a lyophilic solid is more easily wetted by liquid, and the contact angle of the liquid on the surface of the lyophilic solid is generally less than 90 degrees. The surface of a lyophobic solid is not easily wetted by liquid, and the contact angle of the liquid on the surface of the lyophobic solid is generally larger than 90 degrees.

The material of the first transparent optical layer 14 is, for example, a photo-curable transparent resin, and the material of the second transparent optical layer 15 is, for example, a thermo-cured transparent resin. Specific materials of the first transparent optical layer 14 and the second transparent optical layer 15 are not limited, and for example, the first transparent optical layer 14 is a lyophilic acrylic resin or polyimide resin, and the second transparent optical layer 15 is a lyophobic acrylic resin, polydimethylsiloxane, or polytetrafluoroethylene.

In some embodiments of the present disclosure, the thickness of the first transparent optical layer 14 is greater than the thickness of the second transparent optical layer 15. In this way, it is advantageous to reduce the misalignment between the first protrusion 2A and the second protrusion 3A. In some embodiments, the first transparent optical layer 14 has a thickness of 1 to 2 microns and the second transparent optical layer 15 has a thickness of 0.5 to 1.5 microns.

Figure 3:
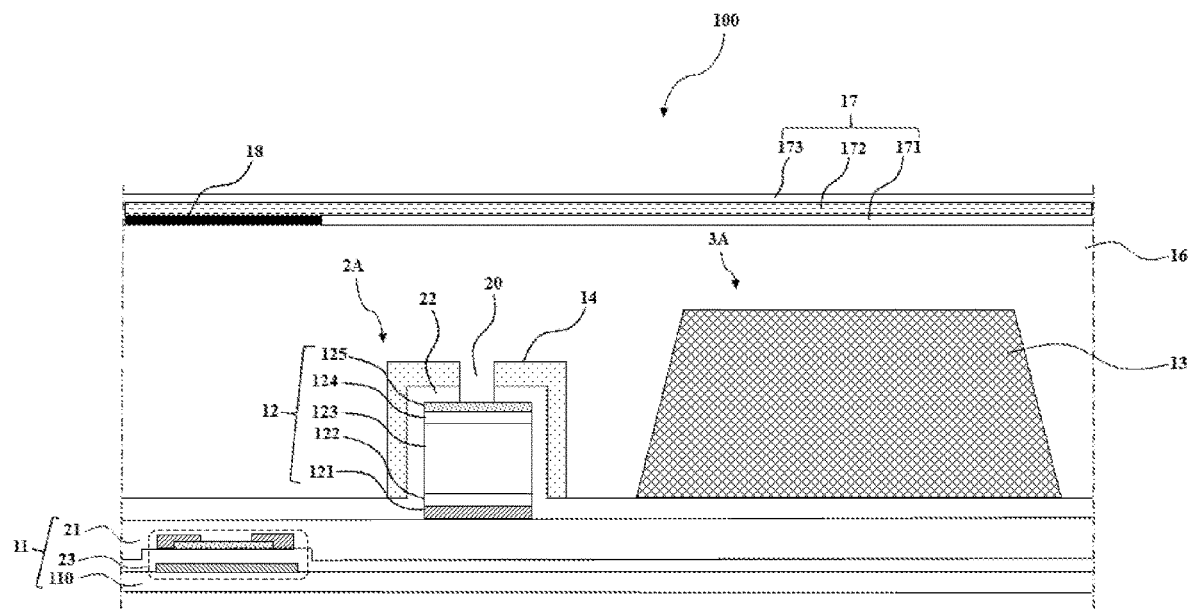
FIG. 3 is a schematic cross-sectional view illustrating a sub-pixel structure of an organic light-emitting display substrate according to another embodiment of the present disclosure.

As shown in FIG. 3, in another embodiment of the present disclosure, only the surface of the first protrusion 2A has the lyophilic first transparent optical layer 14, and the color filter layer 13 of the second protrusion 3A is in direct contact with the planarization layer 16. This also has the following effect: the material wettability of the planarization layer 16 with respect to the surface of the first protrusion 2A is greater than that with respect to the surface of the second protrusion 3A. In addition, the first transparent optical layer 14 has a certain thickness, and thus contributes to reducing the step between the first protrusion 2A and the second protrusion 3A.

Figure 4:
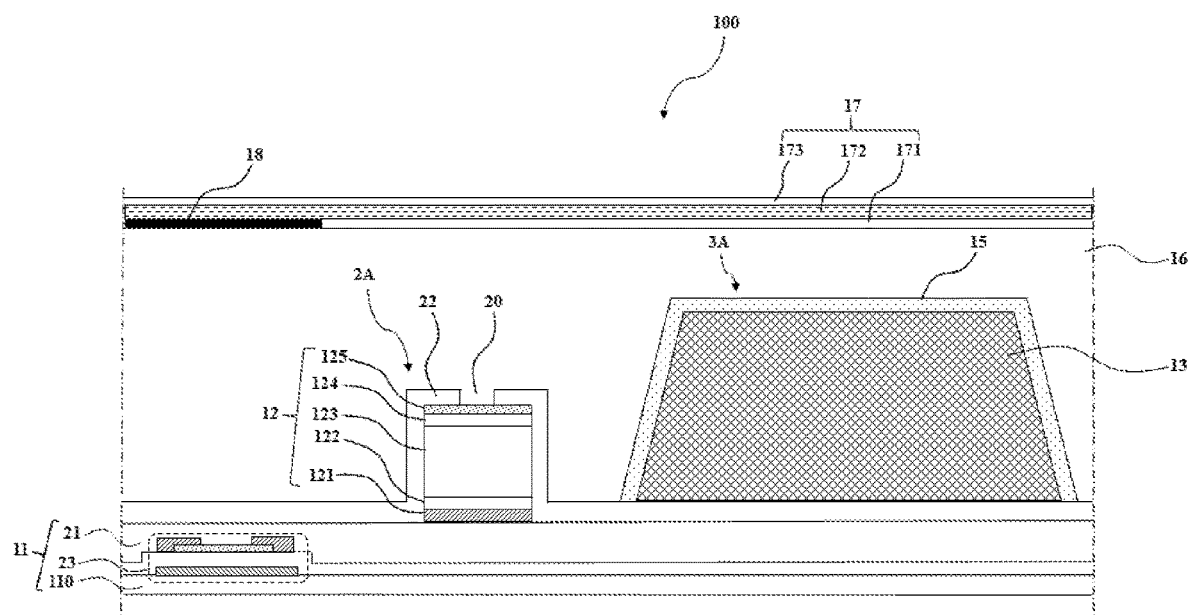
FIG. 4 is a schematic cross-sectional view illustrating a sub-pixel structure of an organic light-emitting display substrate according to still another embodiment of the present disclosure.

As shown in FIG. 4, in yet another embodiment of the present disclosure, only the surface of the second protrusion 3A has the lyophobic second transparent optical layer 15, and the second insulating layer 22 of the first protrusion 2A is in direct contact with the planarization layer 16. This also has the following effect: the material wettability of the planarization layer 16 with respect to the surface of the first protrusion 2A is greater than that with respect to the surface of the second protrusion 3A.

The inventors of the present application further found in the process of implementing the embodiments of the present disclosure that, in the related art, dark current exists in the photoelectric sensing device of some organic light-emitting display substrates, that is, current will be generated even in the absence of illumination, which causes a decrease in sensitivity of the photoelectric sensing device, and thus results in a certain disturbance to the driving compensation of the white organic light-emitting diode. The inventors of the present application found, after a large number of experimental tests, that the reason why the dark current is generated is because the planarity of the manufactured substrate is not good enough.

Figure 5:
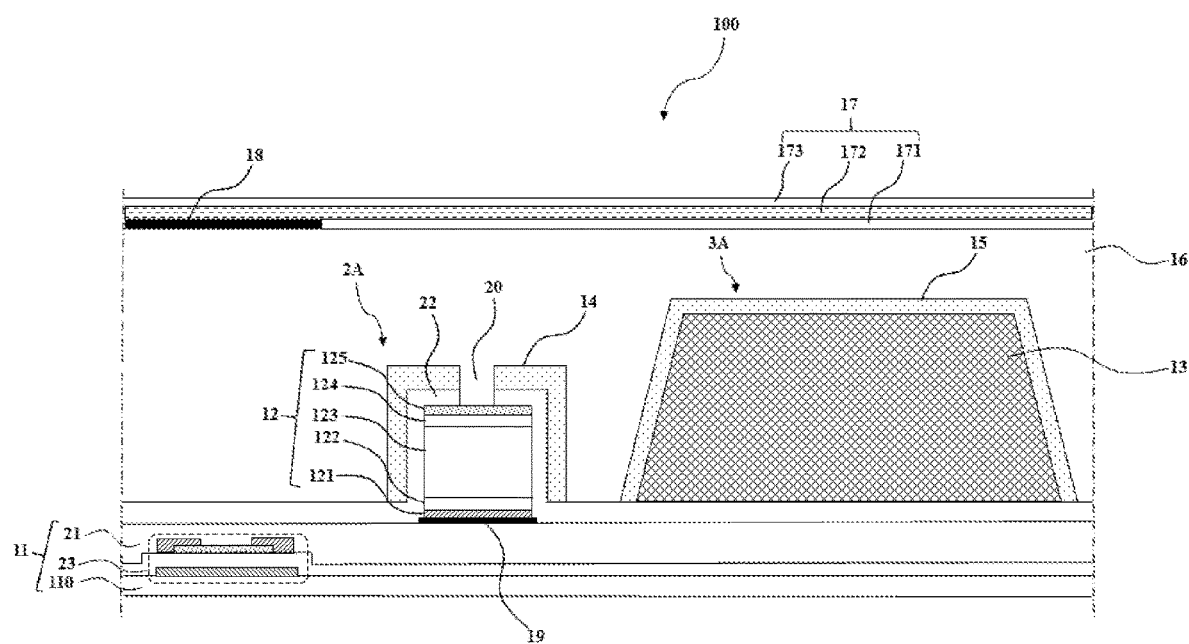
FIG. 5 is a schematic cross-sectional view illustrating a sub-pixel structure of an organic light-emitting display substrate according to a further embodiment of the present disclosure.

To solve the above problem, as shown in FIG. 5, in one embodiment of the present disclosure, the first protrusion 2A further comprises a silicon organic hybrid glass layer 19, located on one side of the photoelectric sensing device 12 close to the base 11, wherein the photoelectric sensing device 12 is located on a surface of the silicon organic hybrid glass layer 19.

Silicon Organic Hybrid Glass (SOG) is a photosensitive material with high transmittance, and can form a surface with high planarity after film formation. By manufacturing the photoelectric sensing device 12 on the surface of the silicon organic hybrid glass layer 19, the generation of the dark current can be reduced, and the sensing sensitivity of the photoelectric sensing device 12 can be improved. On the other hand, the silicon organic hybrid glass layer 19 has a certain thickness, and thus contributes to reducing the misalignment between the first protrusion 2A and the second protrusion 3A.

In some embodiments of the present disclosure, the silicon organic hybrid glass layer 19 has a thickness of 0.2-1 microns.

As shown in FIGS. 2 to 5, in some embodiments of the present disclosure, the first protrusion 2A has a hollow structure 20 exposing the transparent electrode 125 of the photoelectric sensing device 12, and the planarization layer 16 contacts the transparent electrode 125 through the hollow structure 20. In these embodiments, as shown in FIGS. 2, 3 and 5, the hollow structure 20 penetrates through the first transparent optical layer 14 and the second insulating layer 22, so that the planarization layer 16 contacts the transparent electrode 125 through the hollow structures 20. As shown in FIG. 4, in this embodiment, the hollow structure 20 penetrates through the second insulating layer 22, so that the planarization layer 16 contacts the transparent electrode 125 through the hollow structure 20. With this design, propagation loss of light through different materials can be reduced, thereby improving the sensing sensitivity of the photoelectric sensing device 12.

Specific structural forms of the hollow structure 20 are not limited, and may be, for example, a hollow hole, a hollow groove, or a hollow grid. In some embodiments, an orthographic projection of the hollow structure 20 on the transparent electrode 125 of the photoelectric sensing device 12 accounts for 50% to 80% of the area of the transparent electrode 125, so as to improve both the transmittance and the planarity of the planarization layer 16.

At least one embodiment of the present disclosure further provides an organic light-emitting display device comprising an organic light-emitting display substrate of any of the preceding embodiments and a driving circuit. The driving circuit is configured to drive the organic light-emitting display substrate to display. Since the situation of breakage when evaporating the organic light-emitting layer is effectively improved, the production yield of the organic light-emitting display device is improved.

The product type of the organic light-emitting display device is not limited, and may be a flat panel display device, and may also be a flexible display device, and the specific product may be a display, an electronic paper, a tablet computer, a television set, an intelligent display tag, an intelligent display card, and the like.

Figure 6:
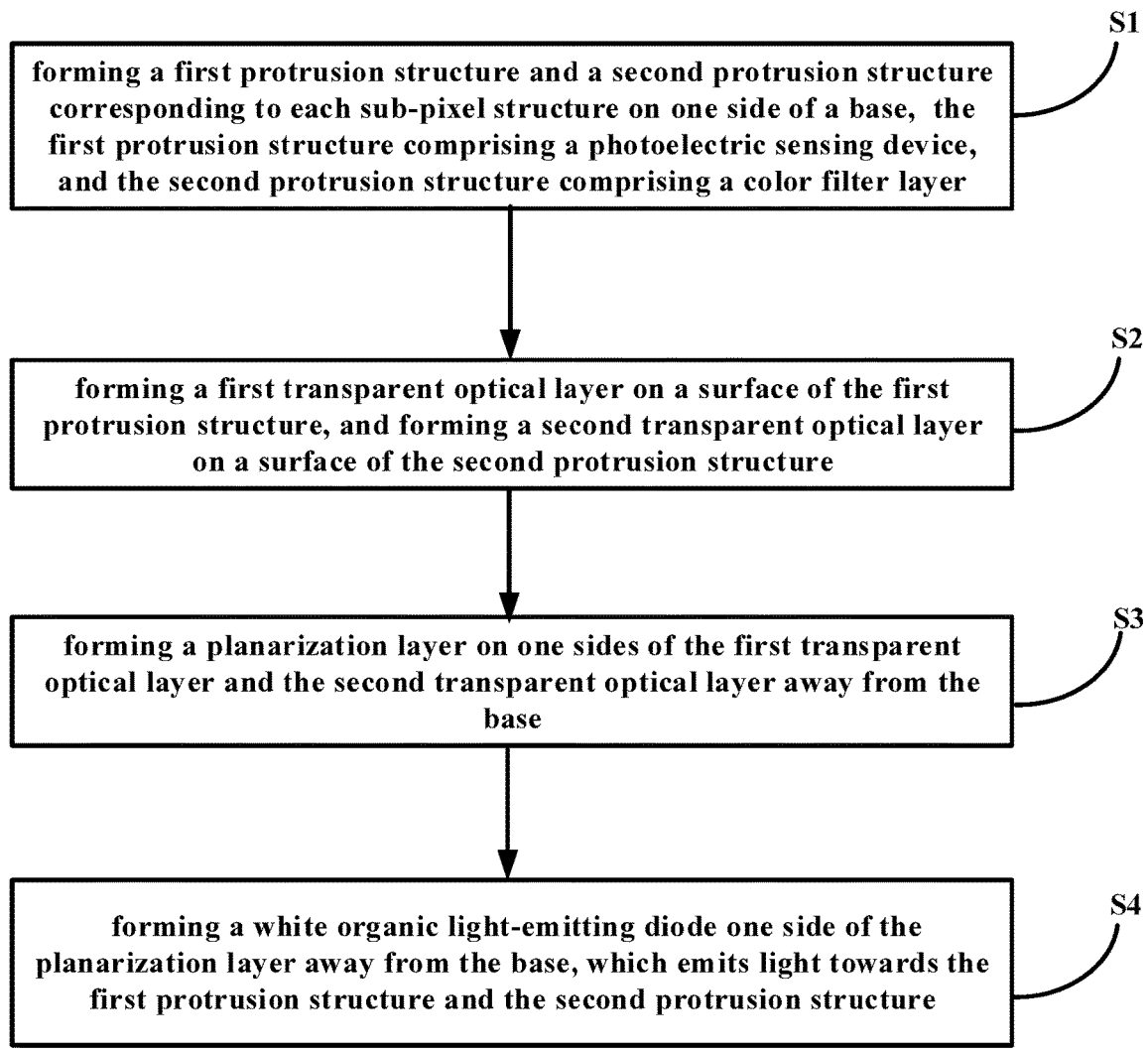
FIG. 6 is a schematic flow chart illustrating a manufacturing method of an organic light-emitting display substrate according to an embodiment of the present disclosure.

As shown in FIG. 6, another embodiment of the present disclosure further provides a manufacturing method of an organic light-emitting display substrate, comprising the following steps S1 to S4.

Figure 7A:
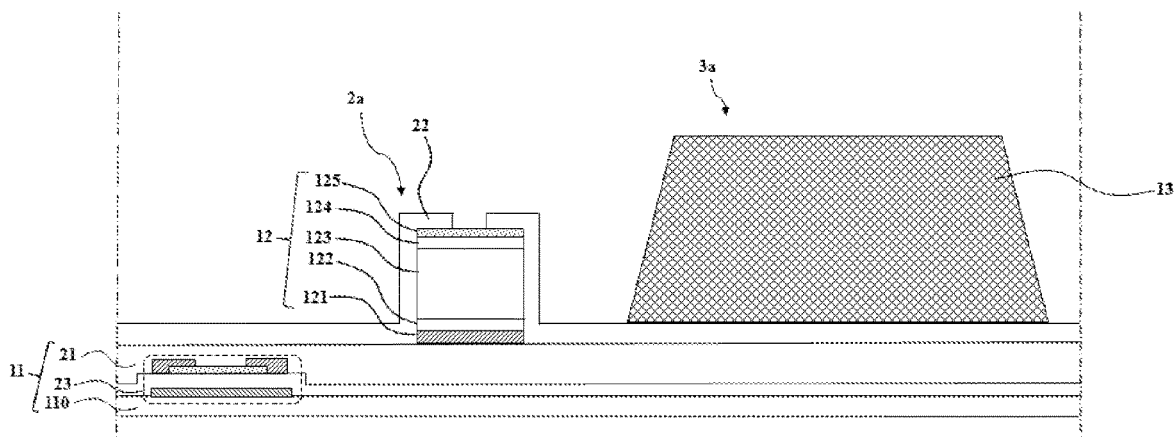
FIG. 7a is a schematic cross-sectional view illustrating a substrate after forming first and second protrusion structures in an embodiment of the present disclosure.

In step S1, a first protrusion structure and a second protrusion structure corresponding to each sub-pixel structure are formed on one side of the base. The first protrusion structure is used to form the first protrusion 2A in the foregoing embodiments, and comprises a photoelectric sensing device. The second protrusion structure is used to form the second protrusion 3A in the foregoing embodiments, and comprises a color filter layer. A protrusion height of the first protrusion structure relative to the base is smaller than a protrusion height of the second protrusion structure relative to the base. The cross-sectional structure of the substrate after this step is completed is shown in FIG. 7a, that is, the first protrusion structure 2A and the second protrusion structure 3A are formed.

To meet the filtering requirement, the thickness of the color filter layer is generally larger than that of the photoelectric sensing device, causing a misalignment to be formed between the first protrusion structure 2A and the second protrusion structure 3A.

Figure 7B:
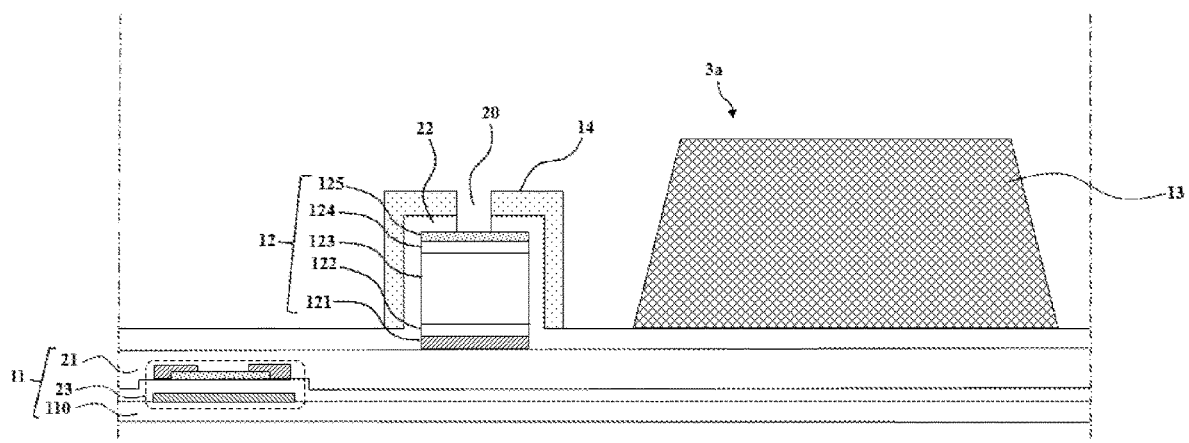
FIG. 7b is a schematic cross-sectional view illustrating a substrate after forming a first transparent optical layer in an embodiment of the present disclosure.
Figure 7C:
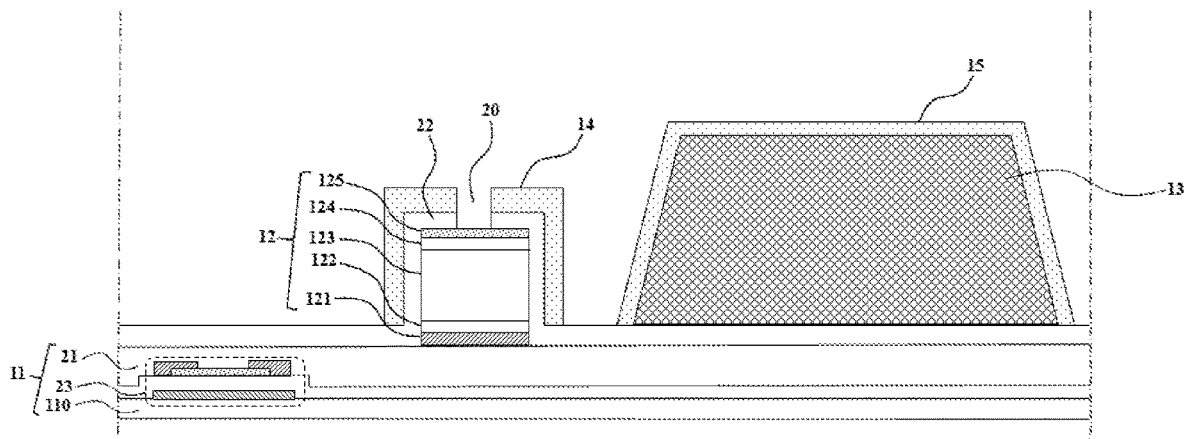
FIG. 7c is a schematic cross-sectional view illustrating a substrate after forming a second transparent optical layer in an embodiment of the present disclosure.

In step S2, a first transparent optical layer is formed on a surface of the first protrusion structure, thereby obtaining the first protrusion 2A in the foregoing embodiments. A second transparent optical layer is formed on a surface of the second protrusion structure, thereby obtaining the second protrusion 3A in the foregoing embodiments. The cross-sectional structure of the substrate after this step is completed is shown in FIG. 7c, that is, the first transparent optical layer 14 and the second transparent optical layer 15 are formed. The first transparent optical layer 14 entirely covers the first protrusion structure and the second transparent optical layer 15 entirely covers the second protrusion structure.

Figure 7D:
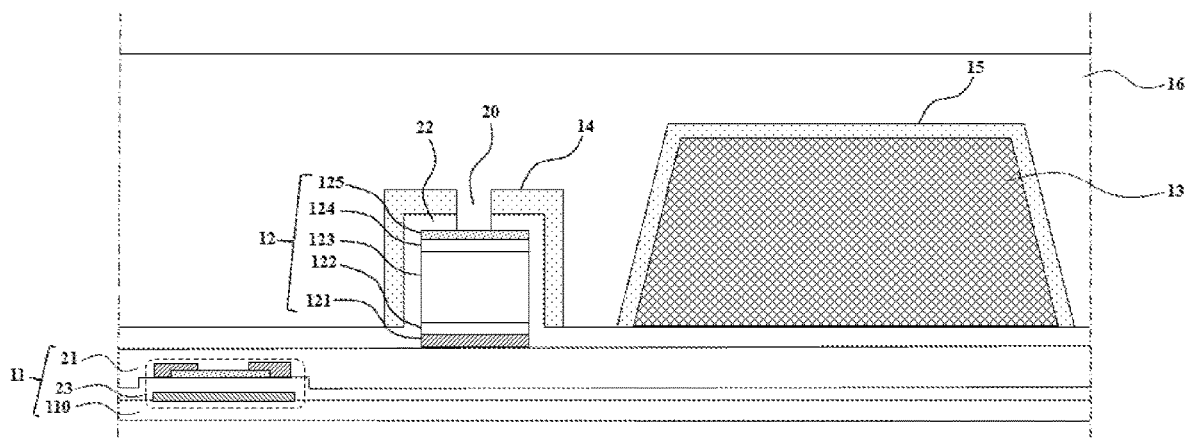
FIG. 7d is a schematic cross-sectional view illustrating a substrate after forming a planarization layer in an embodiment of the present disclosure.

In step S3, a planarization layer is formed on one sides of the first transparent optical layer and the second transparent optical layer away from the base. The cross-sectional structure of the substrate after this step is completed is shown in FIG. 7d, that is, the planarization layer 16 is formed. In some embodiments, the planarization layer 16 is formed by coating and then curing. The planarization layer 16 is in a liquid state prior to curing and the material wettability with respect to the first transparent optical layer 14 is greater than that with respect to the second transparent optical layer 15.

Although there is a misalignment between the first protrusion structure and the second protrusion structure formed in step S1, since the material wettability with respect to the first transparent optical layer is greater than that with respect to the second transparent optical layer, when the planarization layer is manufactured in step S3, the material of the planarization layer having fluidity tends to flow to the area where the first transparent optical layer is in. Therefore, the planarization layer is formed with a greater thickness on one side of the first transparent optical layer away from the base, the misalignment between the first protrusion structure and the second protrusion structure can be compensated for, and the planarity of the formed planarization layer is relatively good.

In step S4, a white organic light-emitting diode is formed on one side of the planarization layer away from the base, that emits light toward the first protrusion structure and the second protrusion structure. The cross-sectional structure of the substrate after this step is completed can refer to FIG. 2, that is, the white organic light-emitting diode 17 is formed.

Since the planarity of the planarization layer formed in step S3 is better, the white organic light-emitting diode manufactured thereon can effectively reduce breakage at the time of evaporating the white organic light-emitting layer, and improve the production yield of the product.

In the step S1, since the first protrusion structure and the second protrusion structure do not overlap, the order of manufacturing the photoelectric sensing device and the color filter layer is not limited. For example, the photoelectric sensing device may be manufactured first and then the color filter layer, or the color filter layer may be manufactured first and then the photoelectric sensing device.

In an embodiment of the present disclosure, as shown in FIG. 7a, the base 11 is a thin film transistor base, and the manufacturing method of an organic light-emitting display substrate further comprises the following steps of manufacturing the thin film transistor base before step S1:

forming thin film transistors 23 arranged in an array on one side of the transparent base 110, for controlling a state of the white organic light-emitting diode; and forming a first insulating layer 21 on one side of the thin film transistor 23 away from the base.

In the manufacturing method of an organic light-emitting display substrate according to an embodiment of the present disclosure, step S1 comprises the following steps:

forming a silicon organic hybrid glass layer on one side of the base; and forming a photoelectric sensing device on a surface of the silicon organic hybrid glass layer.

The photoelectric sensing device manufactured on the surface of the silicon organic hybrid glass layer can reduce the generation of dark current, and improve the sensing sensitivity of the photoelectric sensing device. On the other hand, the silicon organic hybrid glass layer has a certain thickness, and thus also contributes to reducing the step between the photoelectric sensing device and the color filter layer on one side away from the base.

In one embodiment of the present disclosure, in the above step S2, the first transparent optical layer and the second transparent optical layer are formed by a one patterning process, respectively.

The order of manufacturing the first transparent optical layer and the second transparent optical layer is not limited. For example, as shown in FIGS. 7b and 7c, the first transparent optical layer 14 may be formed by the one patterning process, and then the second transparent optical layer 15 by the one patterning process. In addition, the second transparent optical layer may be formed by the one patterning process, and then the first transparent optical layer by the one patterning process.

In order to reduce the production cost and the number of patterning processes for manufacturing the organic light-emitting display substrate, in another embodiment of the present disclosure, in the above step S2, the first transparent optical layer and the second transparent optical layer are formed in a same patterning process, which specifically comprises:

a first sub-step of forming a transparent optical layer on the surface of the first protrusion structure and the surface of the second protrusion structure, respectively, wherein a part of the transparent optical layer on the surface of the second protrusion structure is the said second transparent optical layer, and the transparent optical layer adopts a lyophobic material; and a second sub-step of adjusting to increase the lyophilic property of a part of the transparent optical layer on the surface of the first protrusion structure, so as to form the said first transparent optical layer.

For example, the lyophilic property of a part of transparent optical layer above the first protrusion structure is increased through an ashing process of oxygen plasma, thereby obtaining the first transparent optical layer.

In another embodiment of the present disclosure, in step S2, the first transparent optical layer and the second transparent optical layer are formed in a same patterning process, which specifically comprises:

a first sub-step of forming a transparent optical layer on the surface of the first protrusion structure and the surface of the second protrusion structure, respectively, wherein a part of the transparent optical layer on the surface of the first protrusion structure is the said first transparent optical layer, and the transparent optical layer adopts a lyophilic material; and a second sub-step of adjusting to decrease the lyophilic property of a part of the transparent optical layer on the surface of the second protrusion structure, so as to form the said second transparent optical layer.

For example, the lyophilic property of a part of the transparent optical layer above the second protrusion structure is decreased through an HMDS (Hexamethyldisilazane) process, thereby obtaining the said second transparent optical layer.

In one embodiment of the present disclosure, the manufacturing method of an organic light-emitting display substrate, after forming the photoelectric sensing device and before forming the first transparent optical layer, further comprises: forming a second insulating layer on one side of the photoelectric sensing device away from the base. The first transparent optical layer is formed on one side of the second insulating layer away from the base. In addition, the color filter layer can also be manufactured on one side of the second insulating layer away from the base.

In one embodiment of the present disclosure, the photoelectric sensing device, the second insulating layer, the color filter layer, the first transparent optical layer, and the second transparent optical layer are sequentially manufactured. The patterns of the first transparent optical layer and the second transparent optical layer can be manufactured by a same patterning process or by two patterning processes.

In one embodiment of the present disclosure, in step S2, the lyophilic first transparent optical layer is formed only on the surface of the first pre-manufactured protrusion, and the second protrusion structure is brought into direct contact with the planarization layer. In another embodiment of the present disclosure, in step S2, the lyophobic second transparent optical layer is formed only on the surface of the second pre-manufactured protrusion, and the first protrusion structure is brought into direct contact with the planarization layer. As described above, the effect of improving the planarity of the planarization layer can be still achieved.

In summary, by adopting the manufacturing method of the organic light-emitting display substrate according to the embodiments of the present disclosure, the occurrence of breakage when evaporating the white organic light-emitting layer can be effectively reduced, and the production yield of the product can be further improved.

So far, the embodiments of this disclosure have been described in detail. In order to avoid obscuring the idea of this disclosure, some details well known in the art are omitted. A person skilled in the art can fully understand how to implement the technical solutions disclosed herein according to the above description.

Although some specific embodiments of the present disclosure have been described in detail with examples, it should be understood by a person skilled in the art that the above examples are only intended to be illustrative but not to limit the scope of the present disclosure. A person skilled in the art would appreciate that, the above embodiments can be modified or partial technical features thereof can be equivalently substituted without departing from the scope and spirit of the present disclosure. The scope of the present disclosure is defined by the attached claims.

What is claimed is:

1. An organic light-emitting display substrate comprising a base and a plurality of sub-pixel structures located on one side of the base, at least one of the plurality of sub-pixel structures comprising:
    a first protrusion comprising a photoelectric sensing device and a second protrusion comprising a color filter layer, a protrusion height of the first protrusion relative to the base being smaller than a protrusion height of the second protrusion relative to the base;
    a planarization layer located on one side of the first protrusion and the second protrusion away from the base, and being in contact with surfaces of the first protrusion and the second protrusion, a material wettability of the planarization layer with respect to the surface of the first protrusion being greater than that with respect to the surface of the second protrusion; and
    a white organic light-emitting diode located on one side of the planarization layer away from the base, and emitting light towards the first protrusion and the second protrusion.

2. The organic light-emitting display substrate according to claim 1, wherein:
    the surface of the first protrusion has a lyophilic first transparent optical layer; and/or
    the surface of the second protrusion has a lyophobic second transparent optical layer.

3. The organic light-emitting display substrate according to claim 1, wherein the surface of the first protrusion has a lyophilic first transparent optical layer, the surface of the second protrusion has a lyophobic second transparent optical layer, and a thickness of the first transparent optical layer is greater than that of the second transparent optical layer.

4. The organic light-emitting display substrate according to claim 3, wherein the first transparent optical layer has a thickness of 1 to 2 microns and the second transparent optical layer has a thickness of 0.5 to 1.5 microns.

5. The organic light-emitting display substrate according to claim 1, wherein the surface of the first protrusion has a lyophilic first transparent optical layer, the surface of the second protrusion has a lyophobic second transparent optical layer, a material of the first transparent optical layer comprises a light-cured transparent resin, and a material of the second transparent optical layer comprises a thermo-cured transparent resin.

6. The organic light-emitting display substrate according to claim 1, wherein the first protrusion further comprises a silicon organic hybrid glass layer located on one side of the photoelectric sensing device close to the base, the photoelectric sensing device being located on a surface of the silicon organic hybrid glass layer.

7. The organic light-emitting display substrate according to claim 6, wherein a thickness of the silicon organic hybrid glass layer is 0.2 to 1 microns.

8. The organic light-emitting display substrate according to claim 1, wherein:
    the photoelectric sensing device comprises a receiving electrode, an N-type semiconductor layer, an I-type semiconductor layer, a P-type semiconductor layer, and a transparent electrode, sequentially arranged in a direction away from the base; and
    the first protrusion has a hollow structure exposing the transparent electrode, and the planarization layer is in contact with the transparent electrode through the hollow structure.

9. The organic light-emitting display substrate according to claim 8, wherein the hollow structure comprises a hollow hole, a hollow groove or a hollow grid.

10. The organic light-emitting display substrate according to claim 8, wherein an orthographic projection of the hollow structure on the transparent electrode accounts for 50% to 80% of an area of the transparent electrode.

11. An organic light-emitting display device comprising a driving circuit and the organic light-emitting display substrate according to claim 1.

12. A manufacturing method of an organic light-emitting display substrate, comprising:
    forming a first protrusion structure and a second protrusion structure corresponding to each sub-pixel structure on one side of a base, wherein the first protrusion structure comprises a photoelectric sensing device, the second protrusion structure comprises a color filter layer, and a protrusion height of the first protrusion structure relative to the base is smaller than that of the second protrusion structure relative to the base;
    forming a first transparent optical layer on a surface of the first protrusion structure to obtain a first protrusion, and forming a second transparent optical layer on a surface of the second protrusion structure to obtain a second protrusion;
    forming a planarization layer on one side of the first transparent optical layer and the second transparent optical layer away from the base, wherein a material wettability of the planarization layer with respect to the first transparent optical layer is greater than that with respect to the second transparent optical layer; and
    forming a white organic light-emitting diode one side of the planarization layer away from the base, which emits light towards the first protrusion structure and the second protrusion structure.

13. The manufacturing method according to claim 12, wherein the first transparent optical layer and the second transparent optical layer are formed by a one patterning process, respectively.

14. The manufacturing method according to claim 12, wherein the forming the first transparent optical layer and the second transparent optical layer comprises:
    forming a transparent optical layer on the surface of the first protrusion structure and the surface of the second protrusion structure, wherein a part of the transparent optical layer on the surface of the second protrusion structure forms the second transparent optical layer; and
    increasing a lyophilic property of a part of the transparent optical layer on the surface of the first protrusion structure to form the first transparent optical layer.

15. The manufacturing method according to claim 12, wherein the forming the first transparent optical layer and the second transparent optical layer comprises:
- forming a transparent optical layer on the surface of the first protrusion structure and the surface of the second protrusion structure, wherein a part of the transparent optical layer on the surface of the first protrusion structure forms the first transparent optical layer; and
- decreasing a lyophilic property of a part of the transparent optical layer on the surface of the second protrusion structure to form the second transparent optical layer.

16. The manufacturing method according to claim 12, wherein the forming a first protrusion structure corresponding to each sub-pixel structure on one side of a base comprises:
- forming a silicon organic hybrid glass layer on one side of the base; and
- forming a photoelectric sensing device on a surface of the silicon organic hybrid glass layer.

* * * * *